United States Patent [19]
Jerolimov et al.

[11] Patent Number: 5,551,829
[45] Date of Patent: Sep. 3, 1996

[54] NOTCH FINDER HAVING A FLEXIBLE ALIGNMENT ROD

[75] Inventors: Mark J. Jerolimov, Cupertino; Quincy D. Allison, Boulder Creek, both of Calif.

[73] Assignee: H-Square Corporation, Sunnyvale, Calif.

[21] Appl. No.: 540,959

[22] Filed: Oct. 11, 1995

[51] Int. Cl.$^6$ ............................................. B65G 47/24
[52] U.S. Cl. .......................... 414/757; 198/394; 414/938
[58] Field of Search ........................... 198/394; 414/757, 414/736, 738

[56] References Cited

U.S. PATENT DOCUMENTS

| | | |
|---|---|---|
| 3,997,065 | 12/1976 | Jaksch . |
| 4,311,427 | 1/1982 | Coad et al. ............................... 414/217 |
| 4,441,853 | 4/1984 | Kosugi ..................................... 414/757 |
| 4,662,811 | 5/1987 | Hayden .................................... 414/433 |
| 5,183,378 | 2/1993 | Asano et al. ............................. 414/757 |

OTHER PUBLICATIONS

Semiconductor Wafer Alignment Fixture, IBM Technical Disclosure Bulletin, vol. 10, No. 6, Nov. 1967, pp. 828–829.

*Primary Examiner*—Karen B. Merritt
*Assistant Examiner*—Janice L. Krizek
*Attorney, Agent, or Firm*—Schneck & McHugh

[57] ABSTRACT

An orientation apparatus for aligning indexing notches of disk-shaped members, such as semiconductor wafers, includes a flexible alignment rod that imparts rotation of the disk-shaped members until the indexing notches are registered with the alignment rod. The alignment rod is captured by a displaceable comb member that exposes regions of the rod between adjacent teeth. The teeth ensure that the disk-shaped members are properly aligned. The comb member has a raised operation position in which the disk-shaped members are spaced apart from rollers and has a lowered retracted position in which the weight of the disk-shaped members is transferred to the rollers. A camming mechanism may be used to raise and lower the comb member and alignment rod between the two positions.

17 Claims, 4 Drawing Sheets

FIG.

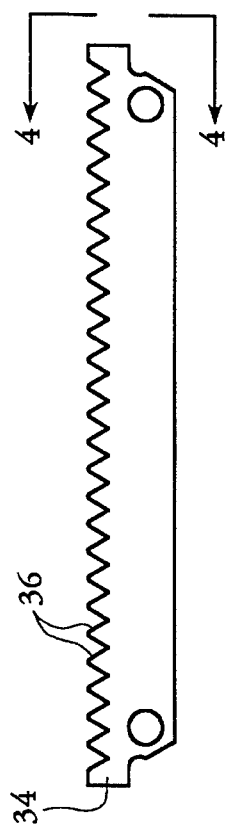
FIG. 3
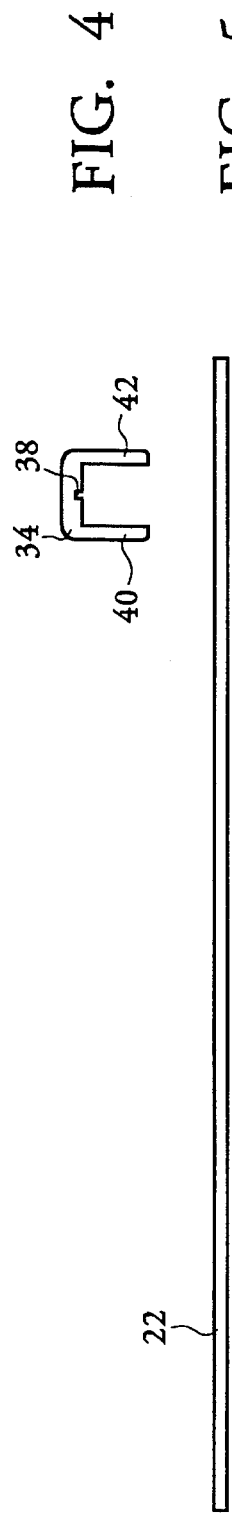
FIG. 4
FIG. 5
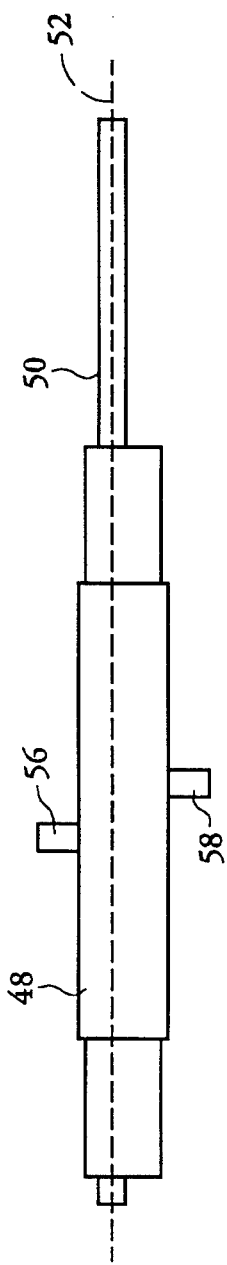
FIG. 7
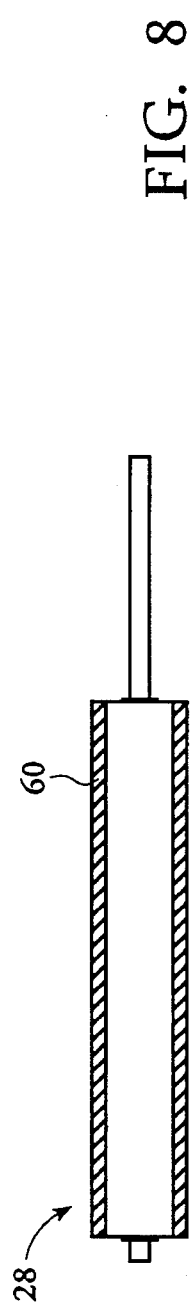
FIG. 8

NOTCH FINDER HAVING A FLEXIBLE ALIGNMENT ROD

TECHNICAL FIELD

The invention relates generally to indexing disk-shaped substrates and more particularly to apparatus for positioning a disk having an indexing notch.

BACKGROUND ART

During various stages of semiconductor wafer processing, precise positioning of a wafer is critical. For example, a fabrication step that includes ion implantation requires that the orientation of the crystalline lattice of the semiconductor material be known. As another example, there must be a precise alignment of a semiconductor wafer relative to a reticle or photomask, if the reticle or photomask is to be used to pattern a conductive layer for forming signal paths along previously fabricated circuit structure on the wafer.

Typically, a semiconductor wafer will include either a "wafer flat" or an indexing notch. A wafer flat or notch is an edge feature and is used to identify the orientation of the wafer. Devices are known for aligning the flats of wafers. U.S. Pat. No. 4,441,853 to Kosugi and U.S. Pat. No. 3,997,065 to Jaksch describe devices for positioning substrates having a flat zone.

Also known are "notch finders" that are designed to align the notches of semiconductor wafers contained within a cassette. The notches have standardized dimensions. The notch finder may have a small diameter stainless steel rod having a coating of polyvinyldenefloride. When the cassette is positioned on the device, the edges of the wafers in the cassette contact the stainless steel rod. Rotation of the stainless steel rod causes the wafers to rotate within the cassette. When a notch of a rotating wafer reaches the stainless steel rod, the notch allows the wafer to drop slightly onto the rod. The stainless steel rod continues to rotate, but the notch-to-rod registration prevents further rotation of the wafer. Within a relatively short time, all of the wafers in the cassette are aligned.

A notch finder may include a mechanism for uniformly rotating the wafer notches after an alignment operation. Rollers may be positioned on opposite sides of the stainless steel rod out of contact with the wafers during the notch-alignment operation. Then, the rollers may be moved upwardly to contact the wafer edges, lifting the notch away from the stainless steel rod. The rollers can then be rotated to relocate the aligned notches to a desired position.

Conventional notch finders operate well for their intended purpose. However, there are concerns relating to operation of the conventional notch finders. As previously noted, the stainless steel rod continues to rotate after the first notch is brought into registration with the rod. Rotation of the stainless steel rod against the stationary edges of the notch generates noises that are potentially disruptive to persons in the general vicinity of the notch finder. More importantly, the relative rotation between the stainless steel rod and the semiconductor wafer may generate particles that settle on the surface of one of the wafers. Particulate contamination will adversely affect the manufacturing throughput of the semiconductor fabrication process. Another concern is that as the rollers are moved upwardly to lift the wafers from the alignment bar, the lifting rollers may cause rotation of some of the wafers. Even a minute amount of undesired rotation may cause difficulties during a subsequent fabrication step.

An object of the invention is to provide an orientation apparatus for aligning disk-shaped members, such as semiconductor wafers, having indexing notches. Another object is to provide such an apparatus that is non-particulating.

SUMMARY OF THE INVENTION

The above objects have been met by an orientation apparatus in which a flexible alignment rod is positioned to rotate at edges of disk-shaped members having edge indexing notches. Supporting structure for the flexible alignment rod is displaceable to define an operation position in which the flexible alignment rod is in contact with the disk-shaped members and to define a retracted position in which the weight of the disk-shaped members is transferred from the flexible alignment rod. The transfer of the weight is by flexure of the alignment rod.

In the preferred embodiment, the disk-shaped members are semiconductor wafers and the displaceable support structure for the flexible alignment rod includes a comb-like member. The comb-like member has an array of teeth arranged in side-by-side fashion. The flexible alignment rod extends through the comb-like member and is exposed between adjacent teeth. The semiconductor wafers are in a conventional cassette, with the pitch of the teeth being equal to the pitch of the wafers, so that each wafer is in contact with an exposed region of the flexible alignment rod between adjacent teeth. The teeth may be V-shaped, thereby acting as a seating mechanism for properly positioning the semiconductor wafers.

In the operation position, the flexible alignment rod and the comb-like member are in a raised condition. The wafers come to rest on the flexible alignment rod and are in spaced relation to a pair of rollers. One of the rollers may be a motor-driven drive roller. The flexible alignment rod is then rotated. While the rotation may be manual, the alignment rod is preferably connected to a drive motor. For each semiconductor wafer, the indexing notch has a radius of curvature that is greater than the radius of the flexible alignment rod. Thus, as the indexing notch is registered with the alignment rod, the alignment rod enters the indexing notch to prevent further rotation of the wafer. If the alignment rod is driven to cause at least 360° of rotation of the wafer workpieces, all of the indexing notches will be aligned along the alignment rod.

Upon achieving the desired alignment, the comb-like member and the flexible alignment rod are moved downwardly until the semiconductor wafers are rested on the rollers. As previously noted, at least one of the rollers is preferably a drive roller. By initiating rotation of the drive roller, the indexing notches can be rotated in unison to a desired position within the cassette. However, this is not critical to the invention.

The selection of a material for forming the flexible alignment rod is important. The material must be non-particulating. The rotation of the alignment rod within the notches should not generate particles which could contaminate the surface of one or more semiconductor wafers. The flexible alignment rod should be wear resistant. Moreover, the selection of a material should be such that the flexible alignment rod is chemical resistant, since there may be times in which the semiconductor wafers are brought into contact with the orientation apparatus shortly after undergoing chemical treatment. Another important property of interest is the coefficient of friction. The friction of the alignment rod along the edges of the semiconductor wafers determines whether rotation of the alignment rod will be translated to the wafers. An acceptable material for forming the flexible alignment rod is nylon.

An advantage of the invention is that the flexible alignment rod provides a gentle translation of rotational energy to the semiconductor wafers. Thus, the operation of the orientation apparatus is not likely to generate contaminating particles. Another advantage is that the selection of a material and the selection of the diameter of the alignment rod relative to the radius of curvature of the wafer notch define a structure that is less likely to cause squeaking after one or more of the indexing notches are brought into alignment with the still rotating alignment rod. Yet another advantage is that the teeth of the comb-like member and a cam mechanism for lowering the comb-like member cooperate to reliably transfer the semiconductor wafers from the flexible alignment rod to the rollers without inducing any rotation of the wafers.

BRIEF DESCRIPTION OF THE DRAWINGS

FIG. 3 is a side view of an upper piece of the comb member of FIG. 2.

FIG. 4 is an end view of the upper piece of FIG. 3, taken along lines 4—4.

FIG. 5 is a side view of the flexible alignment rod of FIG. 2.

FIG. 7 is a side view of a cam of FIG. 2.

FIG. 8 is a side view of a drive roller of FIG. 2.

BEST MODE FOR CARRYING OUT THE INVENTION

Figure 1:
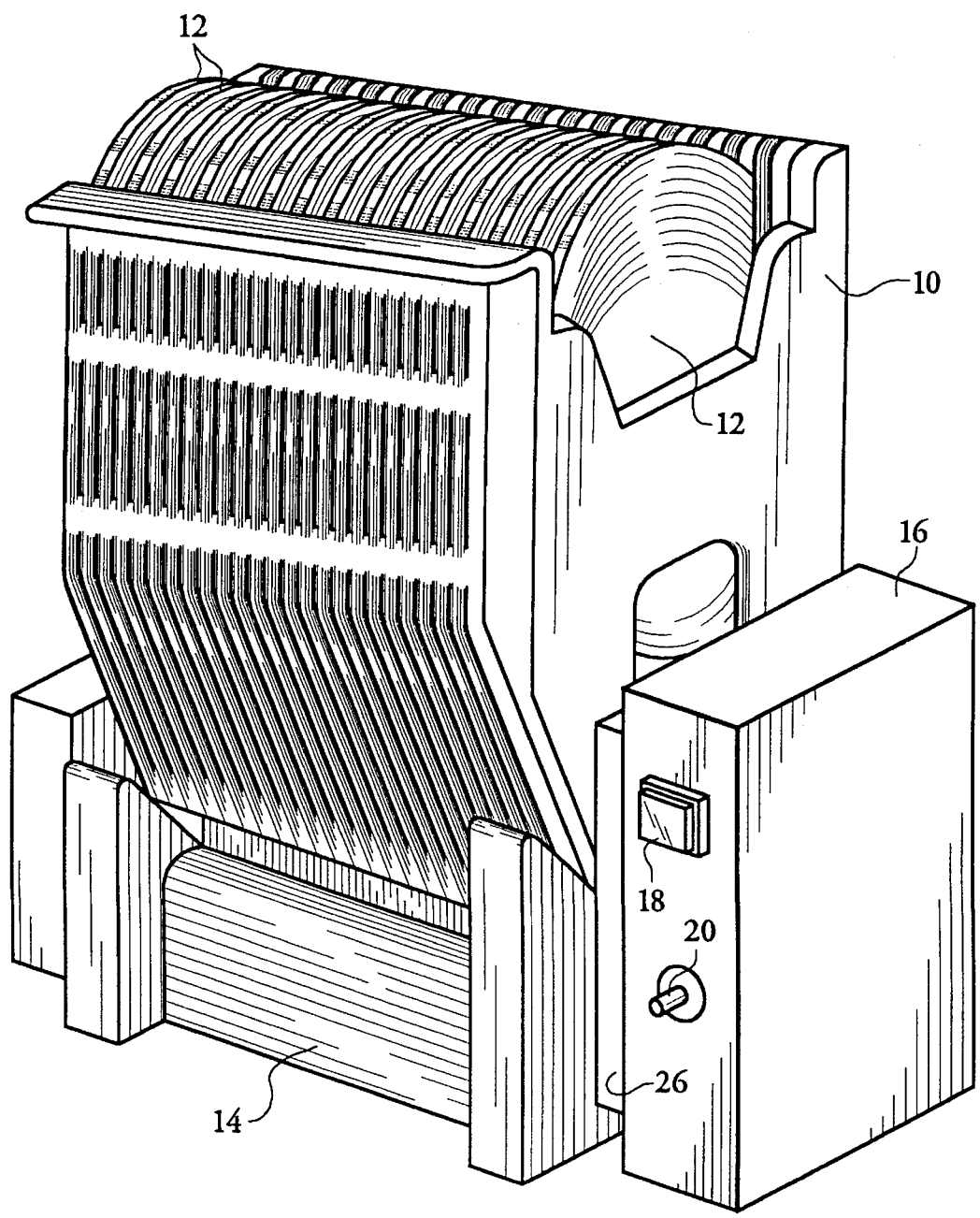
FIG. 1 is perspective view of a cassette of semiconductor wafers resting on an orientation apparatus in accordance with the invention.

With reference to FIG. 1, a cassette 10 of semiconductor wafers 12 is shown as being rested atop an orientation apparatus, sometimes referred to as a notch finder 14. The notch finder is designed to align semiconductor wafers having indexing notches that are dimensioned to meet SEMI standards. The cassette 10 is conventionally used in the industry. The semiconductor wafers are equidistantly spaced within the cassette, so that the wafers do not make contact during storage, transportation or handling.

The notch finder 14 includes a housing 16 for most of the electrical and mechanical components for operating the apparatus. The housing is used to contain particulate matter that may be generated by various components, such as a drive motor. At the exterior of the housing is a "run" switch 18 and a "position" switch 20. As will be explained more fully below, actuation of the run switch 18 will initiate alignment of the indexing notches along a flexible alignment rod, not shown. The position switch 20 may be preset to select a final notch location. After the indexing notches are aligned along the flexible alignment rod, the wafers 12 are uniformly rotated within the cassette 10 until the notches reach the selected final notch location.

Figure 2:
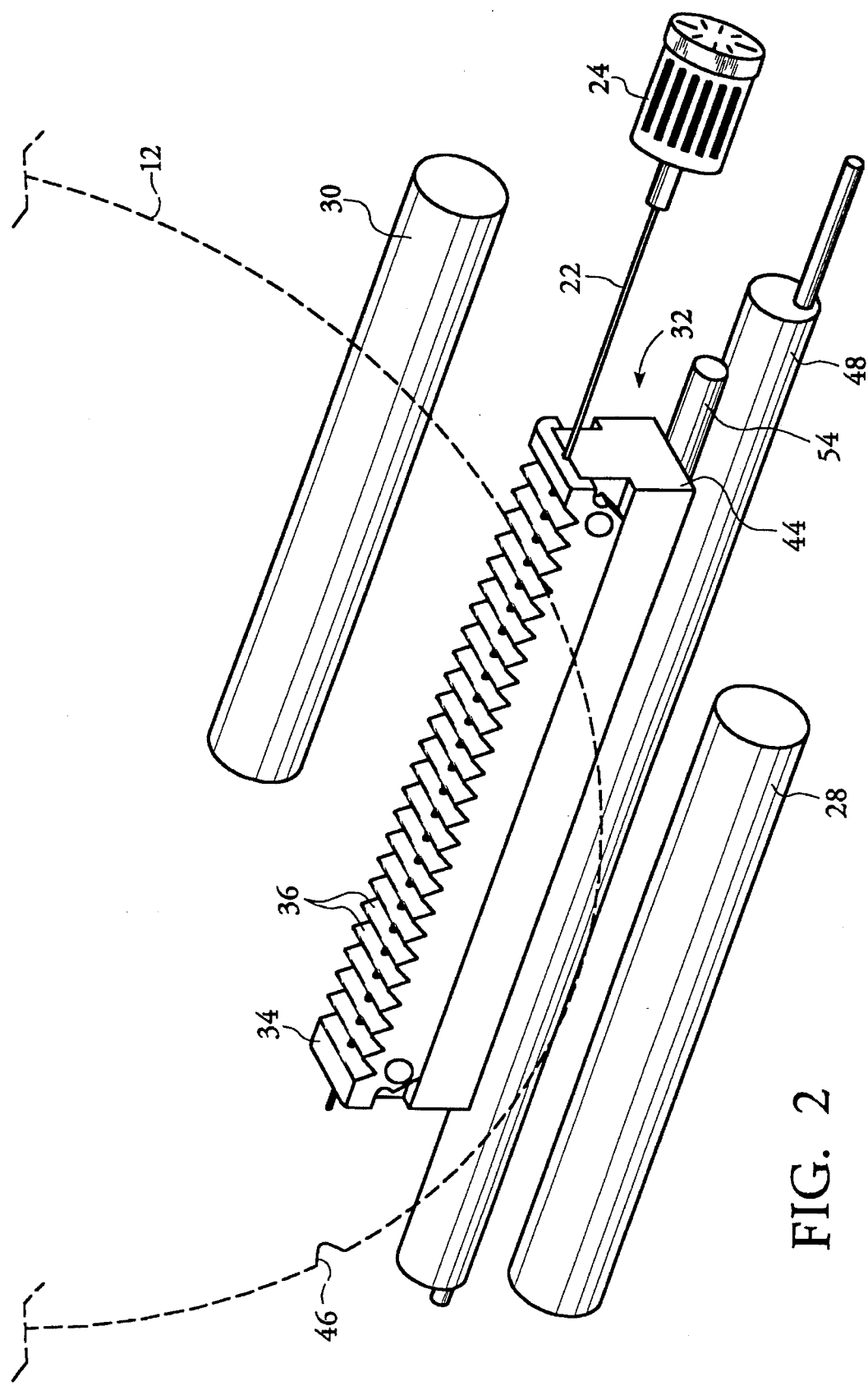
FIG. 2 is a perspective view of a comb member and a flexible alignment rod in an operation position in accordance with the invention.

Referring now to FIG. 2, a wafer 12 is shown as being positioned to contact a flexible alignment rod 22. The alignment rod has a first end connected to a drive motor 24.

Returning briefly to FIG. 1, the drive motor is contained within the housing 16 and is mounted to a faceplate 26. In the preferred embodiment, the drive motor is also coupled to a drive roller 28. In the operation position of FIG. 2, the wafer 12 is resting on the flexible alignment rod 22 and is in spaced relation to the drive roller 28 and to an idler roller 30 that is on the opposite side of the alignment rod from the drive roller.

The flexible alignment rod 22 passes through a two-piece comb member 32. The upper piece 34 of the comb member is also shown in FIG. 3. The upper piece includes an array of teeth 36. The pitch of the teeth corresponds to the pitch of semiconductor wafers in a conventional wafer cassette, but the teeth are 180° out of phase with the wafers, so that a properly positioned cassette will cause the wafers to fall between the teeth. Consequently, the wafers 12 contact regions of the flexible alignment rod 22 exposed between adjacent teeth 36.

An end view of the upper piece 34 of the comb member 32 is shown in FIG. 4. A groove 38 extends along the entire length of the upper piece. The groove is dimensioned to be sufficiently large to capture the flexible alignment rod 22, but to allow the alignment rod to rotate freely. In one embodiment, the diameter of the flexible rod is 0.16 cm and the width and the height of the grooves 38 are each approximately 0.17 cm. The upper piece 34 includes a pair of downwardly depending legs 40 and 42. The upper piece is snap-fit to the lower piece 44 of the comb member 32 using pins, not shown. Alternatively, other means for forming a comb member may be employed. For example, the comb member may be a single piece having rectangular teeth. However, the two-piece comb member allows easy disassembly for purposes of cleaning or replacement. The V-shaped teeth 36 of the preferred embodiment are preferred since they provide a wafer-seating action if the wafer cassette is inadvertently positioned at a slight angle to the notch finder.

FIG. 5 is a side view of the flexible alignment rod 22. For purposes of example, the alignment rod may have a length of 7.55 cm and a diameter of 0.16 cm. The diameter is dependent upon the radius of curvature of an indexing notch 46 and a wafer 12 of FIG. 2. The dimensions of the indexing notch are standardized in the industry. By selecting the radius of the flexible rod to be slightly less than the radius of curvature of the indexing notch, after the alignment rod has entered into the notch, the alignment rod will rotate without rubbing the semiconductor material in a manner that would generate disruptive noises. In the preferred embodiment, the alignment rod is formed of nylon. Nylon provides sufficient friction against the edge of the semiconductor wafer to reliably rotate the wafer until the indexing notch is properly aligned. Moreover, the nylon alignment rod is less likely to generate contaminating particles. Nylon provides the desired resistance to wear and to chemical attack. However, other flexible materials may be possible.

Figure 6:
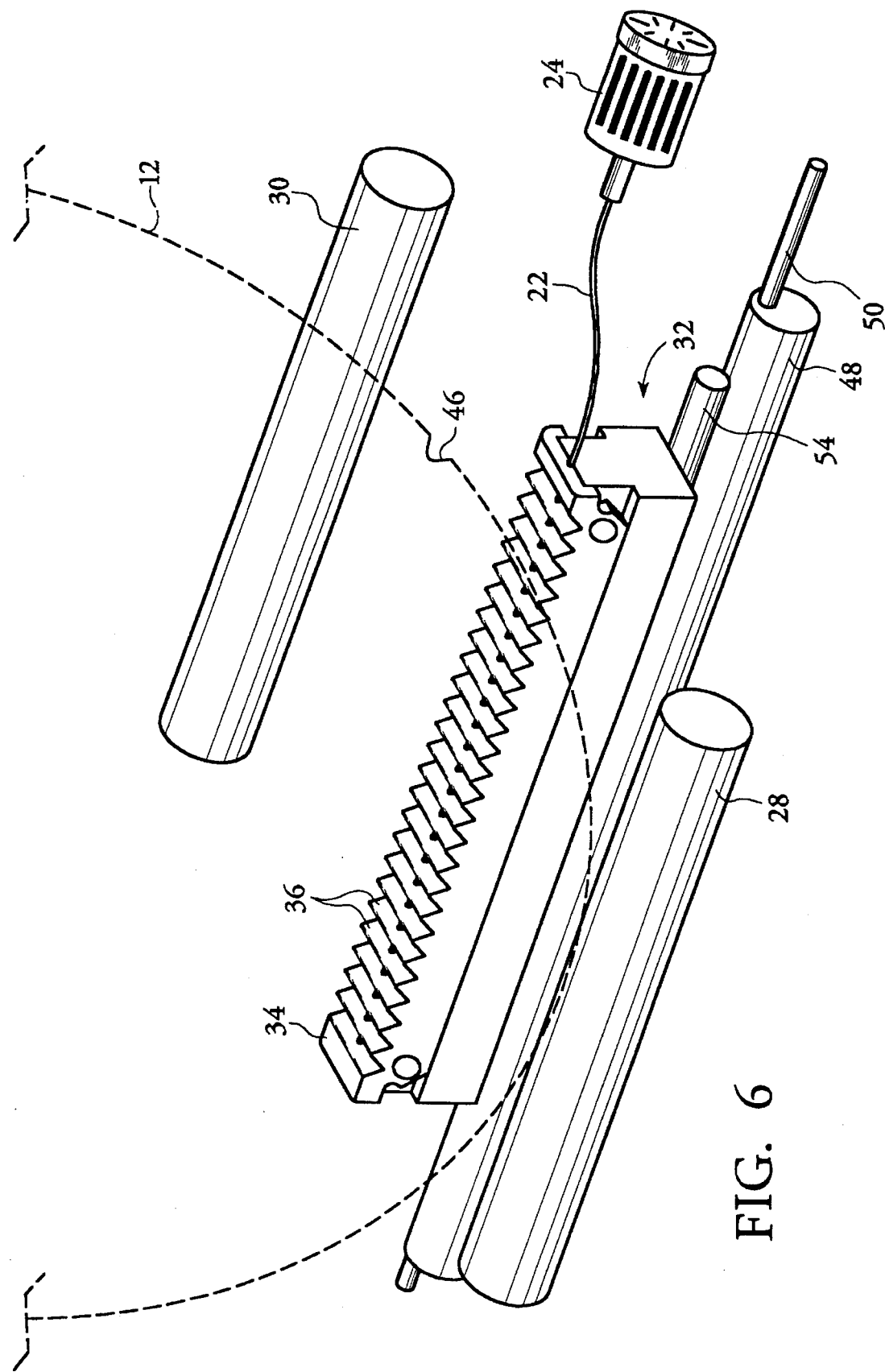
FIG. 6 is a perspective view of the assembly of FIG. 2, shown in a lowered retracted position.

Referring now to FIGS. 2, 6 and 7, the comb member 32 and its entrapped region of the flexible alignment rod 22 may be moved upwardly to the operation position of FIG. 2 or downwardly to the retracted position of FIG. 6. Rotation of a cam 48 determines the position of the comb member 32. A shaft 50 is eccentrically connected to the cam 48. FIGS. 6 and 7 show the cam in a position in which the greater portion of the cam is below the axis 52 of the shaft 50. On the other hand, by rotating the shaft 180°, the larger portion of the cam 48 is above the axis of the shaft, as shown in FIG. 2. Between the surface of the cam 48 and the bottom of the comb member 32 is a roller 54. The roller 54 is affixed to the lower surface of the comb member in a manner that allows free rotation of the roller. As the cam is caused to rotate, the roller 54 is pushed upwardly as it rolls along the external surface of the cam. Upward movement of the roller causes the comb member to move upwardly. While the roller 54 is shown as a cylindrical member, typically the low-friction coupling of the comb member 32 to the cam 48 will be by means of wheels connected to the bottom of the comb member. However, this is not critical.

The shaft 50 that connects to the cam 48 of FIG. 7 may be manually rotated or may be connected to a motor, not shown. The cam may include a pair of stops 56 and 58 that limit rotation of the cam, so that the cam stops with the comb member in the raised operation position or in the lowered retracted position.

When the comb member 32 is in the raised operation position of FIG. 2, the semiconductor wafer 12 rests upon the flexible alignment rod 22 in spaced relation to the drive roller 28 and the idler roller 30. After the indexing notches 46 of all of the semiconductor wafers have been aligned along the length of the alignment rod, the cam 48 is rotated to allow the comb member 32 to descend to the retracted position of FIG. 6. The comb member lowers the semiconductor wafers onto the surface of the drive and idler rollers. The alignment rod 22 is removed from the indexing notches 46 of the semiconductor wafers. Since the portion of the flexible rod that initially supports the wafers is captured within the comb member, the wafers descend uniformly. The flexing of the alignment rod is at the region between the motor 24 and the comb member 32. The transfer of weight from the rod-and-comb assembly to the rollers 28 and 30 is a smooth one that does not induce rotation of the semiconductor wafers.

The indexing notches can then be rotated uniformly to a desired position. The rotation of the drive roller 28 may be manual or may be motor driven. Optionally, the motor 24 can also be connected to either or both of the rollers 28 and 30, since there is no time in which the semiconductor wafers are simultaneously in contact with the rotating alignment rod and the rotating rollers.

In operation, the cassette 10 of semiconductor wafers 12 in FIG. 1 is positioned atop the notch finder 14, with the comb member 32 being in the lowered position of FIG. 6. In this position, the wafers rest atop the driver roller 28 and the idler roller 30. Preferably, the drive roller includes a coating 60 of conductive material, as shown in FIG. 8. For example, the coating may be a conductive polyurethane. The coating establishes a portion of a path for dissipating any electrostatic charge from the semiconductor wafers.

The cam 48 is then rotated to lift the semiconductor wafers 12 from the rollers 28 and 30, as shown in FIG. 2. The weight of the wafers is now on the exposed portions of the alignment rod 22. The alignment rod is rotated by means of the motor 24. The rotation of the alignment rod is translated to the semiconductor wafers until the indexing notches 46 are registered along the alignment rod. The cam is then again rotated to transfer the semiconductor wafers to the rollers.

If desired, the comb-and-rod assembly can be easily cleaned. The upper piece 34 of the comb member 32 is snap-fit onto the lower piece 44. By removing the upper piece, the alignment rod 22 and the upper piece can be cleaned, repaired or replaced.

While the invention has been described with reference to rotating semiconductor wafers, the orientation apparatus may be used in other applications in which disk-shaped members include indexing notches.

We claim:

1. An orientation apparatus for achieving a desired position of a disk-shaped member having an indexing notch comprising:

a flexible alignment rod;

displaceable means for supporting said flexible alignment rod, said displaceable means having an operation position and a retracted position, said flexible alignment rod having an intermediate portion coupled to said displaceable means and having a first end that is stationary such that said flexible alignment rod is caused to flex when said displaceable means is moved between said operation position and said retracted position; and means for supporting said disk-shaped member in spaced relation from said flexible alignment rod when said displaceable means is in said retracted position.

2. The apparatus of claim 1 wherein said displaceable means includes a comb-like member having an array of teeth arranged in side-by-side fashion, said flexible alignment rod extending through said comb-like member and being exposed between adjacent teeth.

3. The apparatus of claim 2 wherein said teeth are V-shaped.

4. The apparatus of claim 2 wherein said displaceable means includes a cam in contact with said comb-like member for selectively raising said comb-like member into said operation position and selectively lowering said comb-like member into said retracted position.

5. The apparatus of claim 1 further comprising means for rotating said flexible alignment rod.

6. The apparatus of claim 5 wherein said means for rotating is a motor connected to said first end of said flexible alignment rod.

7. The apparatus of claim 1 wherein said flexible alignment rod is a cylindrically-shaped length of nylon.

8. The apparatus of claim 1 wherein means for supporting includes a pair of axially fixed rollers, including a drive roller connected to a drive motor.

9. The apparatus of claim 1 further comprising a means for supporting a plurality of disk-shaped members into contact with said flexible alignment rod.

10. An orientation apparatus comprising:

a plurality of wafers, each having a generally circular periphery having an indexing notch;

a cylindrical flexible member having an operation position and a retracted position, with each of said wafers being in contact with said flexible member when said flexible member is in said operation position;

drive means connected to a first end of said flexible member for rotating said flexible member;

support means for moving said flexible member from said operation position to said retracted position, said support means being displaceable relative to said drive means, wherein said flexible member bends along a region adjacent to said first end when said flexible member is moved from said operation position to said retracted position; and roller means for supporting said wafers in spaced relation to said flexible member when said flexible member is in said retracted position.

11. The apparatus of claim 10 wherein said indexing notches have a radius of curvature that is greater than a radius of said flexible member.

12. The apparatus of claim 10 wherein said support means is connected to said flexible member such that an intermediate portion of said flexible member is displaced by a first distance when moved from said operation position to said retracted position, said roller means being spaced apart from said wafers by a second distance less than said first distance when said flexible member is in said operation position.

13. The apparatus of claim 10 wherein said support means includes a comb-like member having a plurality of teeth, said flexible member extending into said comb-like member and being exposed between adjacent teeth.

14. The apparatus of claim 13 wherein said teeth extend upwardly and wherein said support means further includes a cam mechanism connected to said comb-like member for selectively moving said comb-like member vertically between said operation and retracted positions.

15. The apparatus of claim 10 wherein said drive means is a motor.

16. The apparatus of claim 10 wherein said flexible member is nylon.

17. The apparatus of claim 10 wherein said drive means is connected to said roller means to rotate said roller means.

* * * * *